United States Patent [19]

Bohlander

[11] Patent Number: 5,291,095
[45] Date of Patent: Mar. 1, 1994

[54] CATHODE RAY TUBE COMPRISING AN ELECTRON GUN HAVING A PLANE-PARALLEL OPTICAL SYSTEM

[75] Inventor: Johannes H. Bohlander, Eindhoven, Netherlands

[73] Assignee: U.S. Philips Corporation, New York, N.Y.

[21] Appl. No.: 839,138

[22] Filed: Feb. 20, 1992

[30] Foreign Application Priority Data

Mar. 1, 1991 [NL] Netherlands .......................... 9100380

[51] Int. Cl.$^5$ ............................................. H01J 29/62
[52] U.S. Cl. ..................................... 313/417; 313/449; 313/450
[58] Field of Search ................ 313/414, 417, 450, 449

[56] References Cited

U.S. PATENT DOCUMENTS

| | | | |
|---|---|---|---|
| 3,040,205 | 6/1962 | Walker | 313/450 X |
| 3,952,227 | 4/1976 | Van Alphen | 313/449 X |
| 4,028,575 | 6/1977 | van Raalte | 313/105 R |
| 4,086,513 | 4/1978 | Evans, Jr. | 313/458 X |
| 4,961,022 | 10/1990 | Hellings et al. | 313/414 |

*Primary Examiner*—Sandra L. O'Shea
*Attorney, Agent, or Firm*—Robert J. Kraus

[57] ABSTRACT

A cathode ray tube comprising an electron gun having two oppositely arranged conductor patterns. In operation, the electron beams (or electron beam) move between the conductor patterns. It has been found that the electron-optical functions, such as focusing and converging the electron beams, which are fulfilled by electrodes in a conventional gun can be fulfilled by two flat-conductor patterns. Said conductor patterns can be accurately manufactured and arranged relative to each other. This enables the manufacture of complicated lens systems.

14 Claims, 9 Drawing Sheets

CATHODE RAY TUBE COMPRISING AN ELECTRON GUN HAVING A PLANE-PARALLEL OPTICAL SYSTEM

BACKGROUND OF THE INVENTION

The invention relates to a cathode ray tube comprising an electron gun for generating a number of electron beams extending in one plane.

The invention also relates to an electron gun for a cathode ray tube.

Known cathode ray tubes comprise electron guns having a number of electrodes in which apertures are provided for passing electron beams. In operation, the electrodes generate electric fields which influence, for example accelerate, focus, converge or diverge, the electron beams. The aim is to improve the shape and the relative positions of the electron beams which are generated by the electron gun. For this purpose, the electric fields used to influence the electron beams, inter alia, the lens fields for focusing the electron beams, are becoming more and more complex and must meet ever increasing accuracy requirements. In general, the number of electrodes of an electron gun increases and the shape of the apertures in the electrodes becomes more complex according as the demands imposed on the electric fields in the electron gun are higher. The demands imposed upon the electric fields for HDTV (High Definition Television) and CMT (colour monitor tubes) are so high that satisfying them is very hard or involves high costs in a conventional electron gun construction.

SUMMARY OF THE INVENTION

It is an object of the invention to provide a different construction for an electron gun.

For this purpose, a cathode ray tube according to the invention is characterized in that conductor patterns are provided in the electron gun on two oppositely arranged surfaces, which conductor patterns extend parallel to said plane and on both sides thereof, and in that the cathode ray tube comprises means of forming electric fields between the conductor patterns, said conductor patterns being formed so that, in operation, the electric fields vary in the direction of travel of the electron beams and in a direction approximately parallel to said plane and approximately transversely to the direction of travel of the electron beams.

The electron-optical functions, such as, for example focusing, converging or diverging and/or accelerating the electron beams, which in a conventional electron gun are accomplished by electric fields generated between a number of electrodes extending transversely to the direction of travel are accomplished in the cathode ray tube according to the invention by electric fields generated between two flat conductor patterns extending approximately parallel to the direction of travel of the electron beams. Conductor patterns can be accurately provided on the surfaces, for example on plates. A conductor pattern is to be understood to mean within the framework of the invention, a pattern which is made of a material to which an electric voltage can be applied. Said material may be an electrically conductive material but also, for example, a resistance material in the form of, for example, a resistive layer or a semiconductor material. For simplicity, all said possibilities will hereinafter be referred to as "conductive material". The conductor pattern may contain, for example, a number of spaced strips of conductive material which extend approximately transversely to the direction of travel of the electron beams. The strips of conductive material can be provided on the surfaces, for example on plates, with a high degree of accuracy relative to each other, for example, by means of a photolithographical technique. Electric voltages can be applied to these strips in a simple manner, for example, by forming electric connections between the strips and supply means at the edges of the surfaces. The conductor patterns on the two surfaces can be very accurately arranged relative to each other. By virtue thereof, the position and the shape of the electric fields to be generated by the conductor patterns, in operation, can be adjusted in a very accurate and reproducible manner. Calculations have shown that the lens fields which are formed between the conductor patterns can be of at least the same quality as in the known electron guns. Experiments have shown that the calculations correspond to reality. A further advantage of the invention is that the number and complexity of the electric fields, notably the lens fields, can be increased. The number of electrodes which can be accommodated in a conventional electron gun is limited. The accuracy with which a large number of electrodes can be arranged relative to each other is limited, the electrodes have a certain thickness, for example 100-300 $\mu$m, to preclude microphonics. However, this does not impose any restrictions on the conductor patterns. A conductive strip may have smaller dimensions, for example several tens of micrometers. Consequently, lens systems can be constructed having a complexity which cannot be attained with a conventional electron gun. This is very important for HDTV, In an embodiment, the conductor patterns are formed so that, in operation, the generated electric fields make the electron beams coverage or diverge.

In an embodiment, the conductor patterns are formed so that, in operation, the generated electric fields focus the electron beams in two directions (hereinafter termed x- and y-direction) transversely to the direction of travel of the electron beams (hereinafter termed z-direction).

To ensure a proper focusing of the electron beams, the conductor patterns are formed so that the generated electric fields preferably vary approximately periodically with a spatial period which is approximately equal to the distance between the electron beams. Spatial period is to be understood to mean herein the distance between substantially equal parts of the electric fields. Each electron beam then undergoes an approximately equal focusing. There may be small differences between the embodiments as regards the focusing of the electron beams, for example, to improve the astigmatism of the electron beams. Preferably, the quotient of the spatial period and the distance between the conductor patterns is greater than 0.5. For a quotient smaller than 0.5, it is difficult to produce a quadripolar field which is sufficiently strong to focus the electron beams.

Preferably, the number of periods of the generated fields exceeds the number of electron beams. By virtue thereof adverse effects at the edges can be reduced.

The spatial period may vary, viewed in the direction of travel of the electrons. This permits focusing and divergence or convergence of the electron beams to be realized simultaneously.

The invention also relates to a cathode ray tube comprising an electron gun for generating one electron beam, conductor patterns being provided in the electron gun on two oppositely arranged surfaces, which conductor patterns extend in planes approximately parallel to the direction of travel of the electron beam on both sides of the electron beam, and the cathode ray tube comprises means of forming electric fields between the conductor patterns, which conductor patterns are so formed that, in operation, the electric fields vary in the direction of travel of the electron beam and in a direction approximately parallel to said planes and approximately transversely to the direction of travel of the electron beam.

An embodiment of the cathode ray tube according to the invention is characterized in that the conductor pattern has a meander-shaped resistor across which an electric voltage can be applied.

By virtue thereof, few process steps are required and there are few contact points.

BRIEF DESCRIPTION OF THE DRAWING

The invention will be explained in greater detail by means of a few exemplary embodiments and with reference to the accompanying drawing, in which.

The Figures are not drawn to scale. In general, corresponding parts bear the same reference numerals in each of the Figures.

DESCRIPTION OF THE PREFERRED EMBODIMENTS

Figure 1:
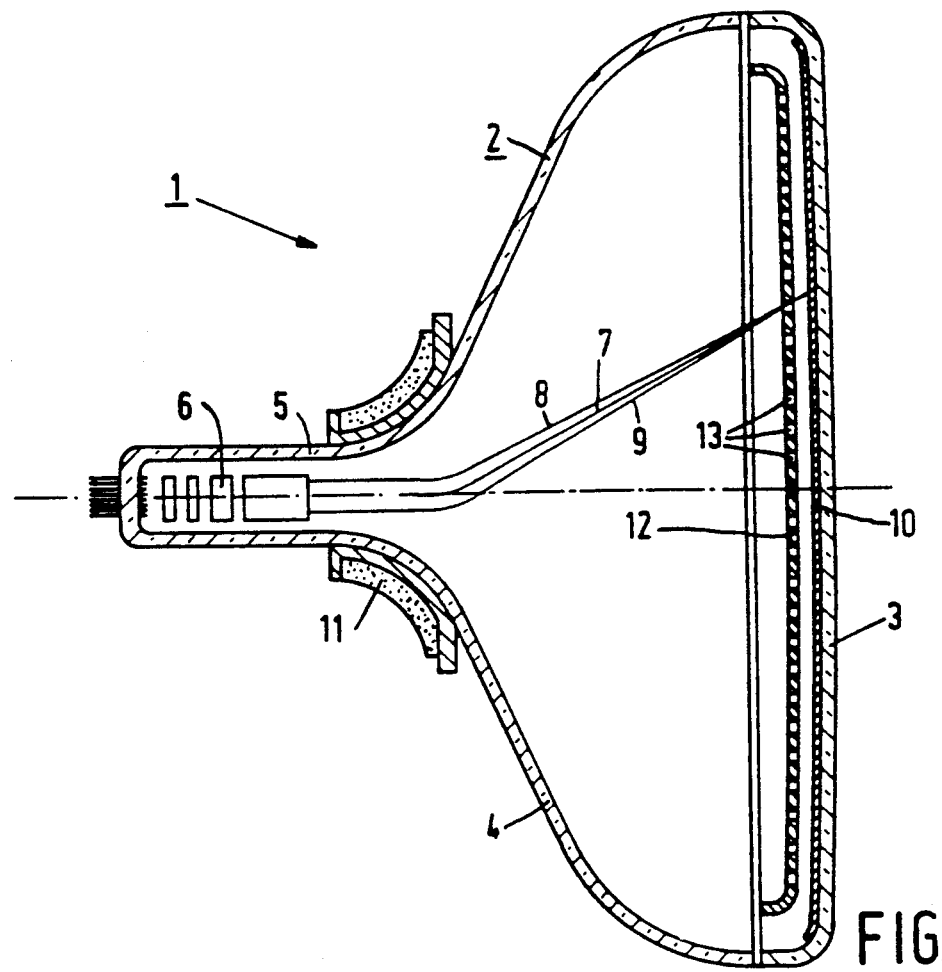
FIG. 1 is a sectional view of a cathode ray tube according to the state of the art.

A cathode ray tube, in this example colour display tube 1, comprises an evacuated envelope 2 which consists of a display window 3, a cone portion 4 and a neck 5. In the neck 5 there is provided an electron gun 6 for generating three electron beams 7, 8 and 9 which extend in one plane, the in-line plane which in this case is the plane of the drawing. A display screen 10 is provided on the inside of the display window. The display window 10 comprises a large number of phosphor elements luminescing in red, green and blue. On their way to the display screen 10 the electron beams 7, 8 and 9 are deflected across the display screen 10 by means of deflection unit 11 and pass through a colour selection electrode 12 which comprises a thin plate with apertures 13 and which is arranged in front of the display window 3. The three electron beams 7, 8 and 9 pass through the apertures 13 of the colour selection electrode such that they intersect at a small angle and, consequently, each electron beam impinges on phosphor elements of only one colour.

Figure 2:
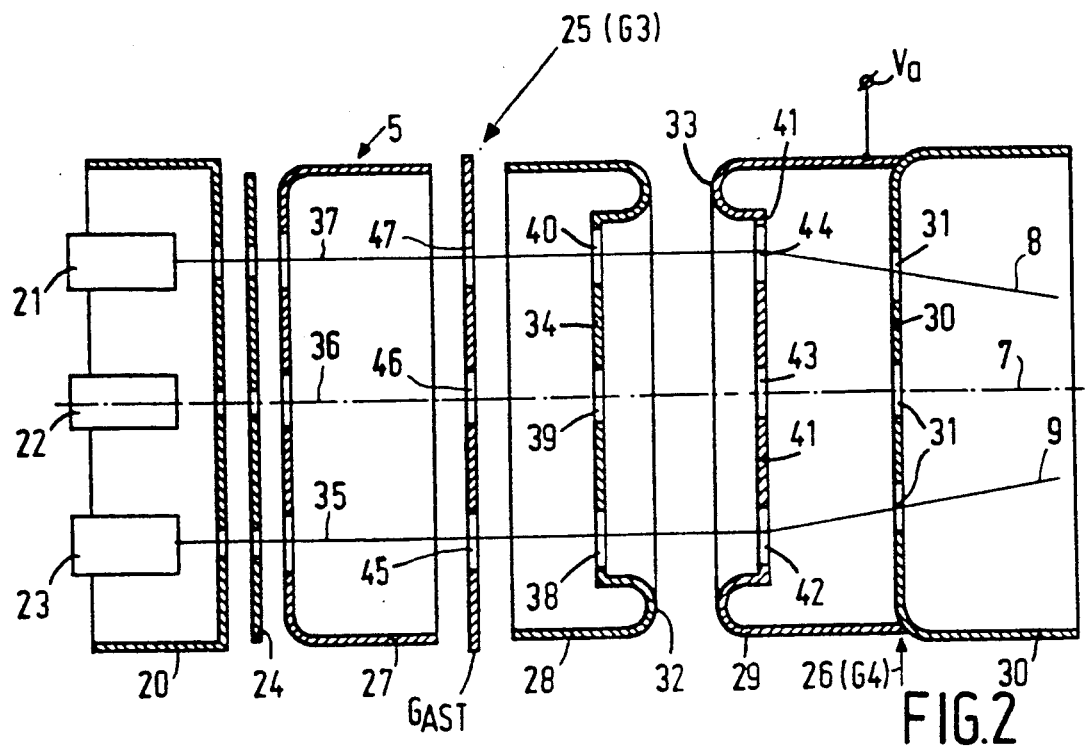
FIG. 2 is a sectional view of an electron gun according to the of the art.

FIG. 2 is a sectional view of a known electron gun, in this example an electron gun as known from EP-A-0231964. The electron gun comprises a common electrode 20 in which three cathodes 21, 22 and 23 are secured, and a common plate-shaped screen grid 24. The three electron beams 7, 8 and 9 whose axes are coplanar are focused by means of electrode systems 25 (G3) and 26 (G4) which are common to the three electron beams. Electrode system 25 comprises two cup-shaped electrodes, a first electrode 27 and a second electrode 28, the open ends of which face towards each other. The main lens is formed by the first electrode system G3 and the second electrode system, or anode, G4. Electrode 26 comprises one cup-shaped portion 29 and a centring bush 30 in the bottom of which apertures 31 for passing the electron beams are formed. Electrode 28 is provided with an edge 32 which extends towards electrode 26 and electrode 26 is provided with an edge 33 which extends towards electrode 28. Apertures 38, 39 and 40 are provided in the recessed portion 34 which extends perpendicularly to the axes 35, 36 and 37 of the electron beams 9, 7 and 8. Apertures 42, 43 and 44 are formed in the recessed portion 41 which extends predominantly perpendicularly to the axis 36 of the central electron beam 7. The apertures in the electrodes must be accurately formed and they must be accurately formed relative to each other in an electrode. Auxiliary electrode $G_{AST}$, which is in the form of a flat plate having elongated apertures 45, 46 and 47, is provided isolatedly at some distance from the main lens. The electrodes must be accurately arranged relative to each other. The apertures in the electrodes must be manufactured with a high degree of accuracy. A greater number of electrodes and auxiliary electrodes having ever more complicated shapes are added to the electron gun according as more demands are imposed on the electric fields forming the lenses. In this respect, the electron gun shown herein is relatively simple. Some constructions comprise approximately 15 electrodes and auxiliary electrodes. HDTV, however, requires an even further improvement of the electric fields for the electron beams, which is impossible or possible only to a small degree with a conventional electron gun and involves high costs.

Figure 3:
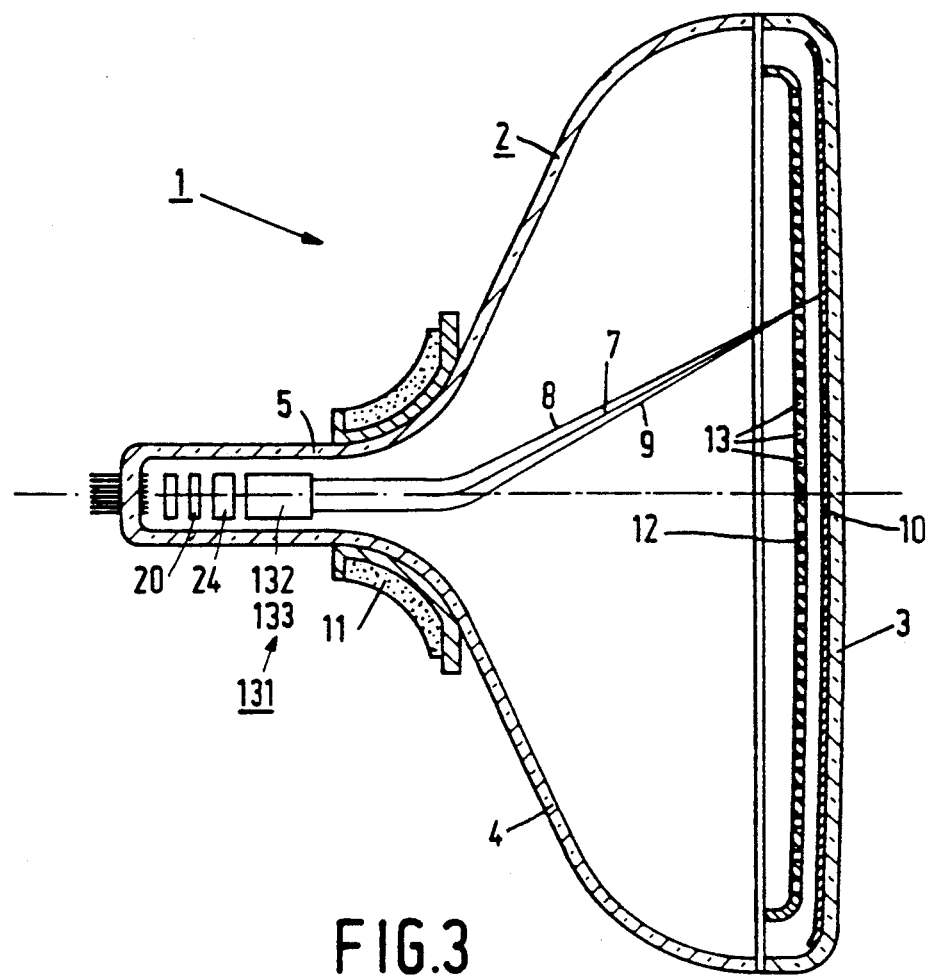
FIG. 3 is a sectional view of a cathode ray tube according to the invention.
Figure 4:
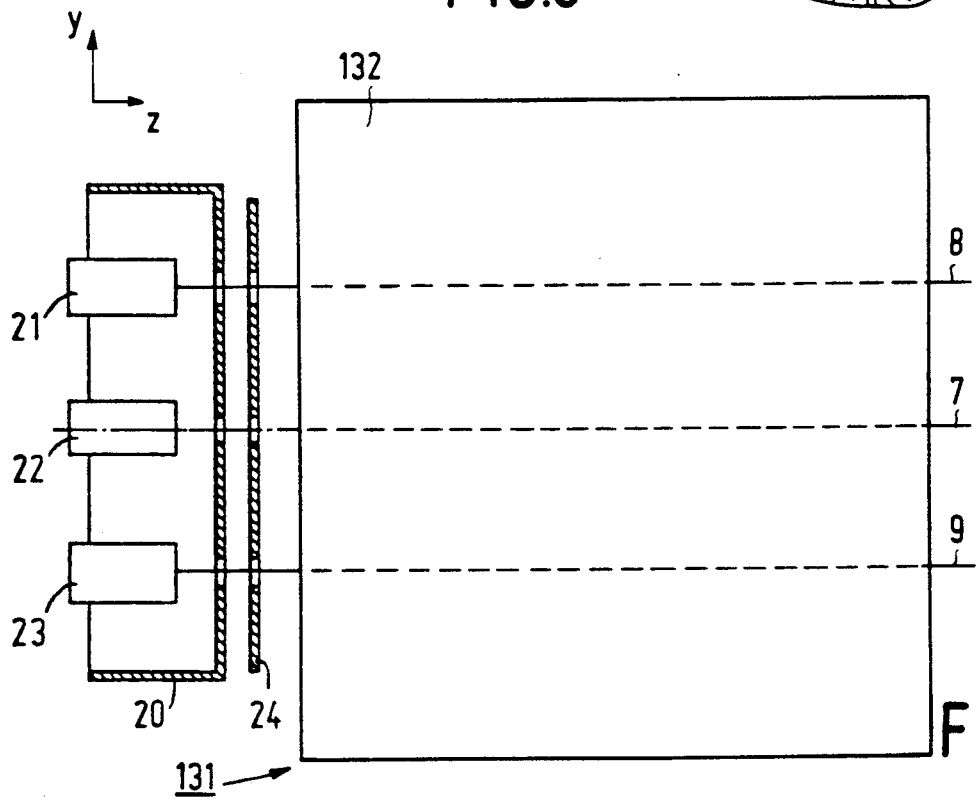
FIG. 4 is a sectional view and partly a top view of an electron gun for a cathode ray tube according to the invention.

It is an object of the invention to provide a different type of electron gun. FIG. 3 is a sectional view of a cathode ray tube according to the invention. Electron gun 131 comprises cathodes 21, 22 and 23 and electrodes 20 and 24. The electron gun further comprises two plates, in this case glass plates 132 and 133 which are coplanarly arranged. FIG. 4 is partly a top view (glass plate 132) and partly a sectional view (cathodes 21, 22 and 23 and electrodes 20 and 24) of the electron gun 131. During operation, the electron beams move between the glass plates 132 and 133. Conductor patterns are provided on the glass plates. The cathode ray tube comprises means of applying electric potentials to the conductor patterns. In operation, electric fields, inter alia, lens fields and acceleration fields are formed between the glass plates. The conductor patterns can be very accurately provided by, for example, photolithographic techniques. The number of elements which have to be arranged relative to each other is substantially reduced.

Figure 5A:
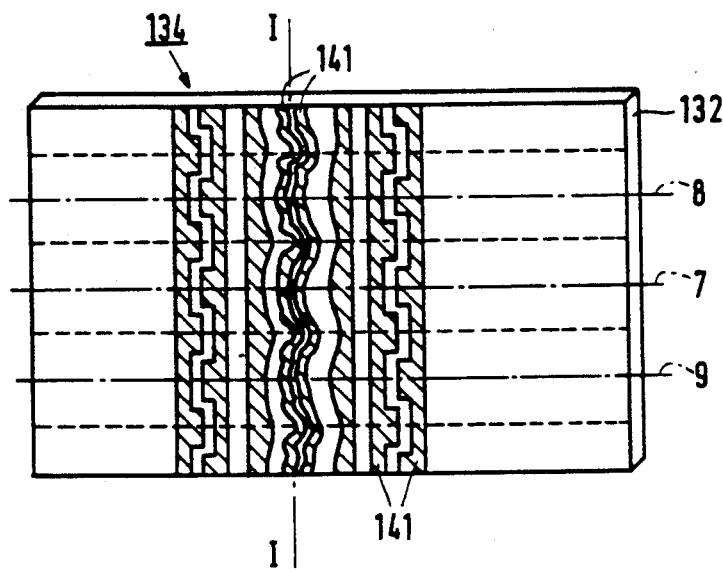
FIGS. 5a and 5b are bottom views of flat plates provided with a conductor pattern for an electron gun for a cathode ray tube according to the invention.

FIG. 5a is a bottom view of a flat plate 132. A conductor pattern 134 having a number of conductive strips 141 is provided on said flat plate. A corresponding conductor pattern is provided on the other flat plate 133. The strips form electric fields which, viewed in a direction transversely to the electron beams 7, 8 and 9 and in the plane of the electron beams 7, 8 and 9 (and, hence, approximately parallel to the planes in which the conductor patterns extend (said direction is indicated in FIG. 5a by the line I—I and in FIG. 5b by the x-direction)), vary approximately periodically. The spatial period is approximately equal to the distance between the electron beams. As a result thereof each electron beam is subjected to approximately the same electric field and the electric field between the electron beams differs from the electric field for the centre of the electron beams.

Figure 5B:
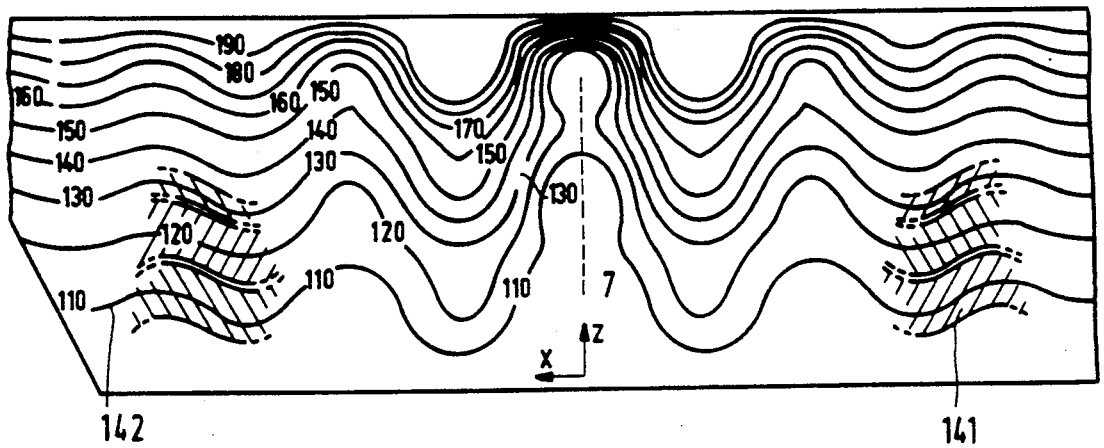

FIG. 5b shows a detail of a plate. In said Figure, a number of equipotential lines 142 are drawn. The potential (in Volt) is indicated. An electric field which is built up according to the equipotential lines 142 varies in the direction of travel of the electrons (z-direction) and in a direction transversely to the z-direction and parallel to the plane through the electron beams (x-direction). The focusing action of such a potential field is explained by means of the FIGS. 6a up to and including 6d. The direction of travel of electron beam 7 is indicated as the z-direction. Around said equipotential lines conductive areas 141 are provided on the surface of the plate. When the indicated potentials are applied to said conductive areas 141, an electric field which is approximately in accordance with the indicated equipotential lines is formed between the plates. Said field accelerates the electrons in the electron beam in the z-direction and focuses electron beam 7 in the x-direction and in a direction transversely to the x-direction and the z-direction, which direction is hereinafter also referred to as the y-direction.

Calculations have shown that the lens fields which are formed between the plates can be of the same quality as in the known electron guns. Experiments have shown that the calculations correspond to reality. In addition to the above-mentioned advantage that the lenses formed can be more accurately arranged relative to each other (the known electron guns generally have a number of lenses which are arranged behind each other), a further advantage of the invention is that the number of lens fields can be substantially increased. The number of electrodes which can be accommodated in an electron gun is limited because there are limits to the accuracy with which a large number of electrodes can be arranged relative to each other and because the electrodes have a certain thickness to preclude microphonics. However, this does not limit the number of conductive strips on the surfaces, which in this case are flat plates. Consequently, lens systems can be constructed having a complexity which cannot be attained with a conventional electron gun. This is important for, in particular, HDTV.

A further advantage is obtained, for example, in embodiments in which prefocusing takes place by means of electrodes. Such prefocusing causes positive spherical aberration, i.e. the relatively outwardly located rays in the prefocusing lens are deflected too much, causing the focal point of the outermost part of an electron beam to be positioned closer to the electron-optical lens, viewed in the z-direction, than the focal point of the central part of the electron beam. Such a positive spherical aberration cannot be compensated in a conventional electron gun. Due to said lens error only the central part of the prefocusing lens can be used, i.e. the diameter of the electron beam has to be substantially smaller than the lens diameter. Conductor patterns as shown above, enable electron-optical lenses to be produced having a negative spherical aberration, i.e. the relatively outwardly located rays are deflected to a smaller degree. Embodiments of the cathode ray tube according to the invention comprise conductor patterns between which an electron-optical lens having a negative spherical aberration and an electrode lens having a positive spherical aberration are formed during operation. Thus, the spherical aberrations caused by both electron-optical lenses compensate each other at least partly. The electrode lens may be, for example, a prefocusing lens, in which case a main lens is formed between the conductor patterns, or the electrode lens may be, for example, a main lens in which case a prefocusing lens is formed between the conductor patterns. A smaller degree of spherical aberration is important for HDTV.

Figure 6A:
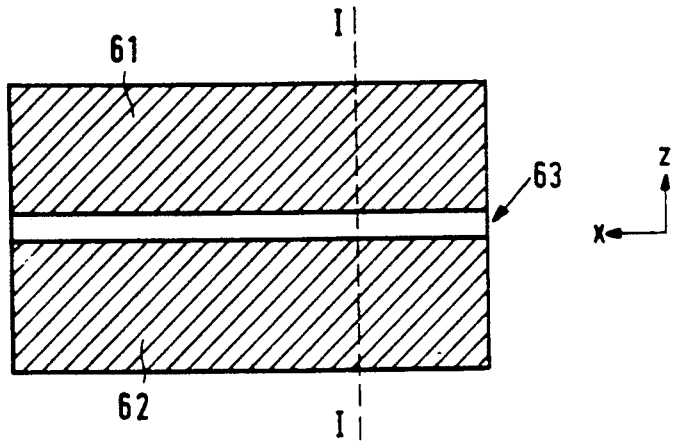
FIGS. 6a up to and including 6d illustrate the effect of the fields generated between the conductive strips.
Figure 6B:
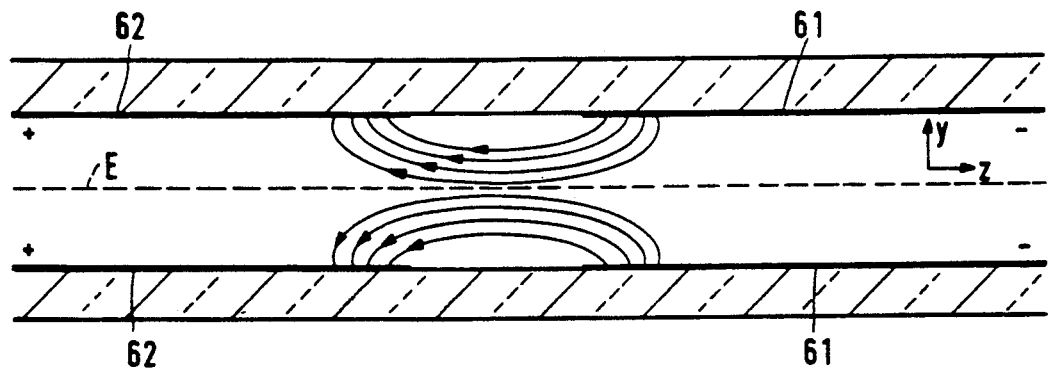
Figure 6C:
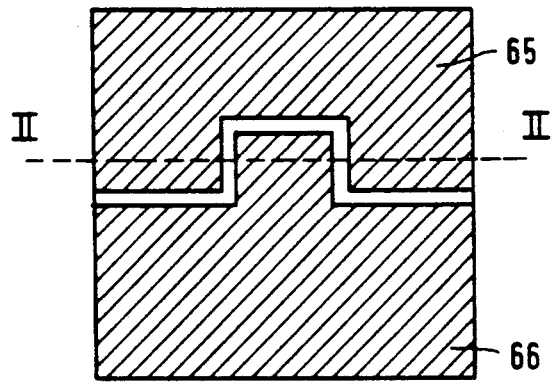
Figure 6D:
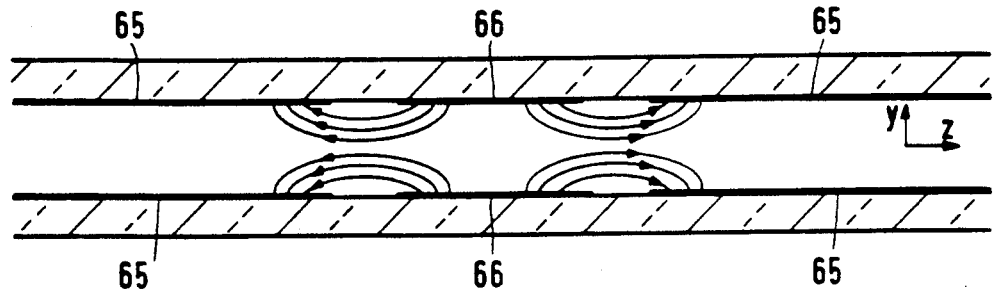
Figure 7A:
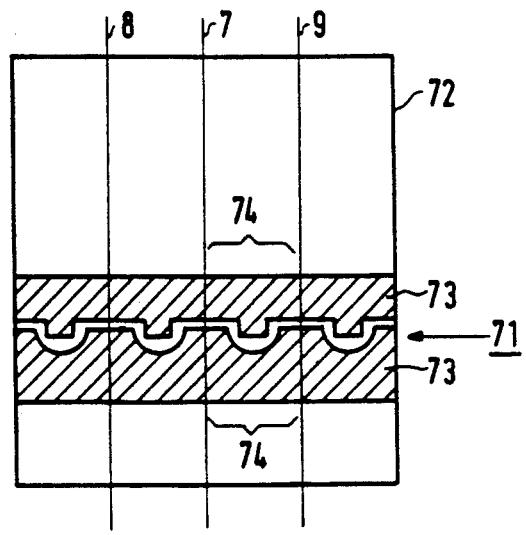
FIGS. 7 up to and including 15 show further examples of the invention.
Figure 8:
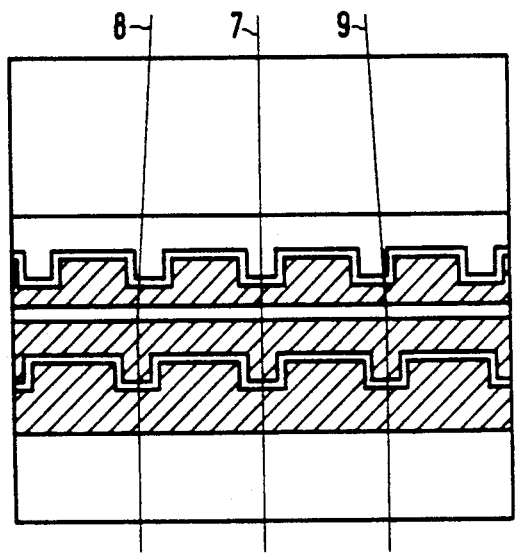
Figure 9:
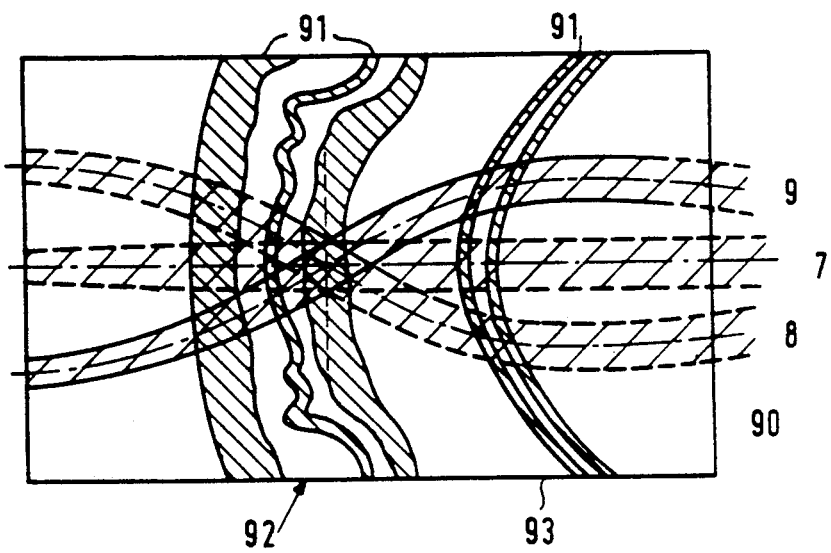
Figure 7B:
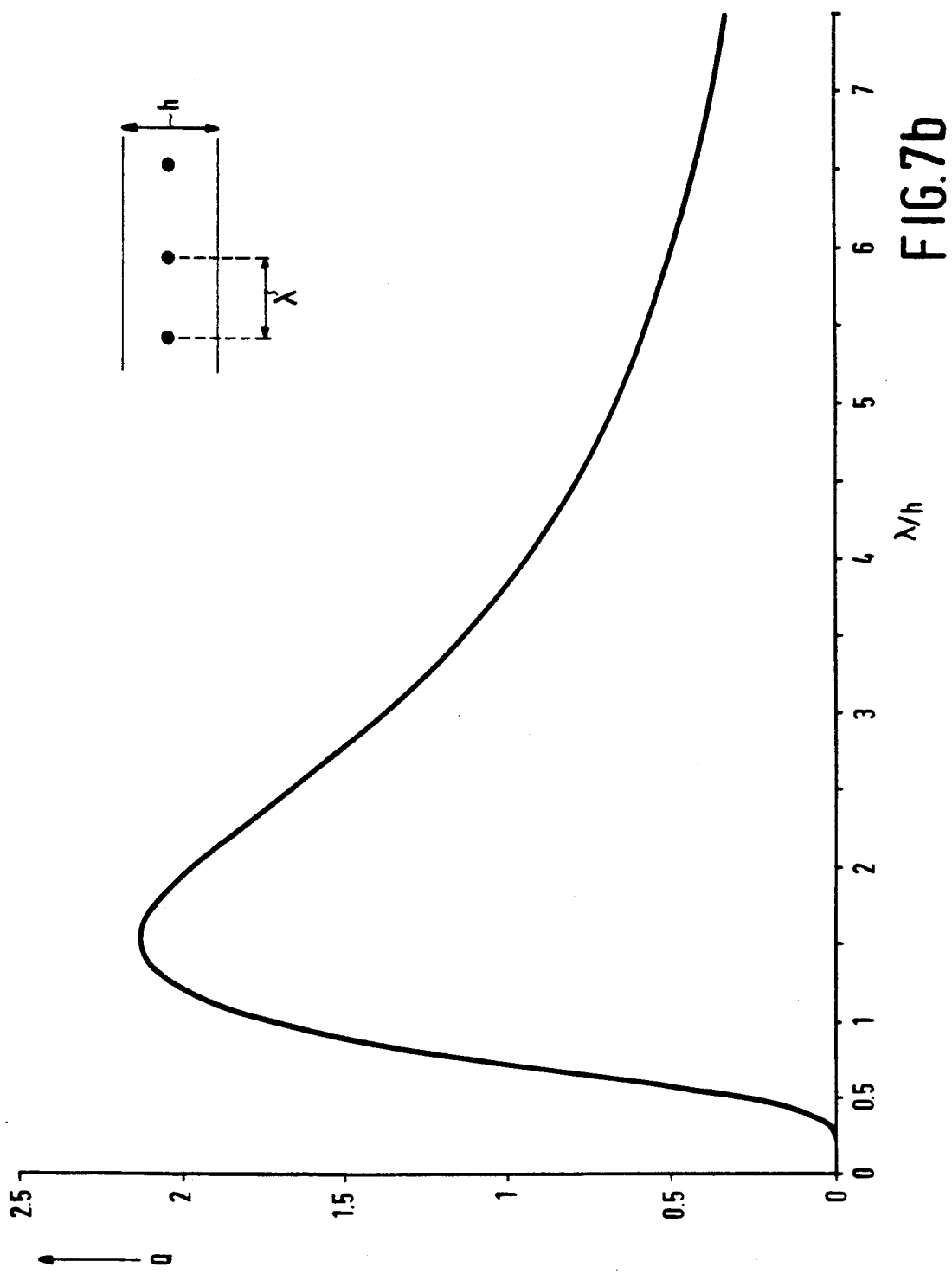

FIGS. 6a up to and including 6d illustrate the effect of fields generated between the strips. In the FIGS. 6a up to and including 6d the direction along the electron beam is defined as the z-direction, the direction transversely to the electron beam and transversely to the plates is defined as the y-direction. FIG. 6a is an elevational view of two conductive areas 61 and 62 which are separated by an insulating area 63. FIG. 6b is a sectional view taken on the line I—I. Said line extends parallel to the direction of travel of the electron beams (z-direction). The conductive areas 61 and 62 are provided on flat plates 64 and 65. In operation, two different electric potentials are applied to the areas 61 and 62 so that a potential difference is applied between the areas 61 and 62. Due to this, electric fields are generated. Said electric fields focus an electron beam E in the y-direction as shown in FIG. 6b. In the x-direction (the direction perpendicular to the y-direction and the z-direction) both the beam section and the direction of the beam remain unchanged. The electric field is not subject to variation in the x-direction. Such an arrangement does not enable an electron beam to be focused in two directions, i.e. the x-direction and the y-direction. FIG. 6c is a diagrammatic top view of the shape of conductive areas with which a quadripolar lens is formed. FIG. 6d is a sectional view taken on the line II—II. The electric field formed between the areas 65 and 66 enlarges the beam section in the y-direction and reduces the beam section in the x-direction. The shapes and distances between the areas 65 and 66 are to be selected so that the reduction in the x-direction exceeds the enlargement in the y-direction. If an electron beam passes through, in succession, a lens as shown in FIGS. 6a and 6b and a lens as shown in FIGS. 6c and 6d, the beam section is reduced in both the x-direction and the y-direction, i.e. the combination of both lenses acts as an approximately rotationally symmetrical lens. Octapolar fields and higher-order lens fields can also be formed. A proper combination of said lens fields enables a desired focusing of the electron beams. Calculations have shown that a rotationally symmetrical lens field can be produced and experiments have shown that said calculations correspond to reality. It is noted, that a certain form of astigmatism, i.e. the electron beams are not completely symmetrically focused, is desired for certain applications, for example, to compensate astigmatism caused by the deflection field with counter-astigmatism caused in the electron gun. FIG. 7a shows a further example of a conductor pattern 71 on a flat plate 72. The conductor pattern 71 comprises a number of conductive areas 73 which, viewed in a direction transversely to the electron beams, consist of a predominantly repetitive subpattern 74. The conductor pattern has a periodicity with a spatial period λ which is approximately equal to the distance between the electron beams. As a result thereof, the generated electric fields are approximately periodical. To preclude that the side faces of the conductor pattern have an effect on the electron beams, the subpattern is preferably continued next to the outermost electron beam. In this example the subpattern (indicated in the Figure by the area between brackets) is repeated four times for three beams. There may be small differences between the central subpattern and the outermost subpatterns because, for example, for certain applications the outermost beams are preferably somewhat differently focused than the central beam. The generated fields exhibit approximately a periodicity with a spatial period. FIG. 7b shows the relative strength Q of a quadripolar field as a function of the quotient $\lambda/h$ of the spatial period $\lambda$ which corresponds approximately to the distance between the electron beams and the distance h between the conductor patterns. Preferably, said quotient is greater than 0.5. For values smaller than 0.5 the relative strength of the quadripolar field is small. The curve shows a maximum for $\lambda/h$ between 1 and 2, approximately at 1.5. Preferably, said quotient is situated in this range. If, for example, the distance between the electron beams is approximately 7 mm, then the distance between the patterns is preferably less than 14 mm, and preferably approximately 4.7 mm. FIG. 8 shows a further embodiment of the invention. This Figure shows that the periodicity or the pitch between the subpatterns can be varied. As a result thereof the beams 7, 8 and 9 are bent towards each other as shown in the Figure. The same effect can be obtained by providing the patterns in a curved configuration relative to the electron beams, as shown in FIG. 9. In FIG. 9, glass plate 90 is provided with conductive areas 91. In this example the beams cross each other in area 92 and are bent towards each other in area 93. In this example the generated electric fields vary in such a manner that the electron beams are converged.

Figure 10:
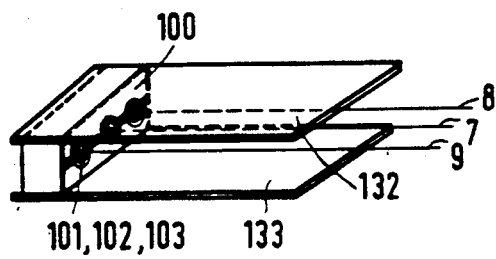
Figure 11:
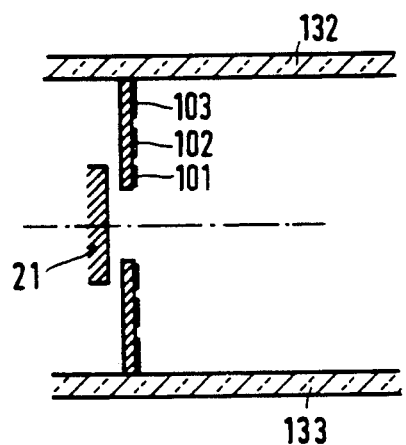

FIGS. 10 and 11 show yet another embodiment of the invention. In this example the electrodes 20 and 24 of FIG. 4 are replaced by a flat plate 100 having conductor areas 101, 102 and 103 forming a planar triode. As a result thereof the number of elements used for the construction of the electron gun has been further reduced. Thus, in this exemplary embodiment a part of the electrodes is constructed on a plate which extends transversely to the electron beams.

Figure 12A:
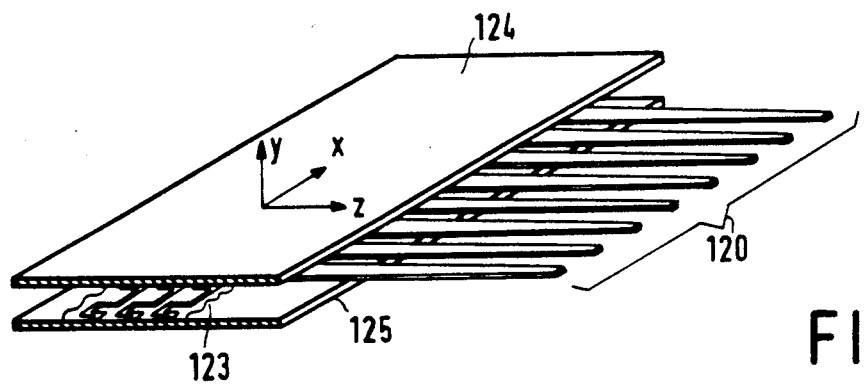
Figure 12B:
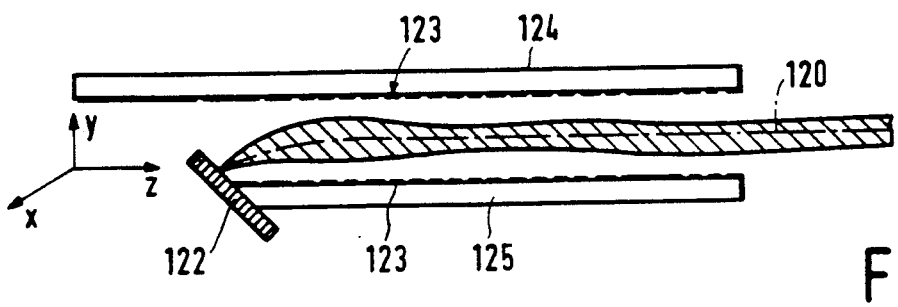
Figure 13A:
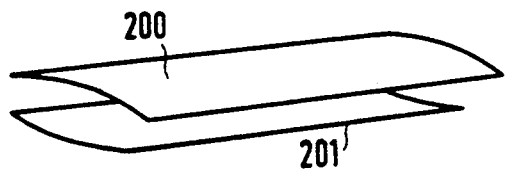
Figure 13B:
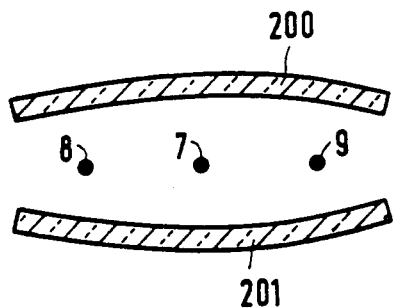
Figure 14:
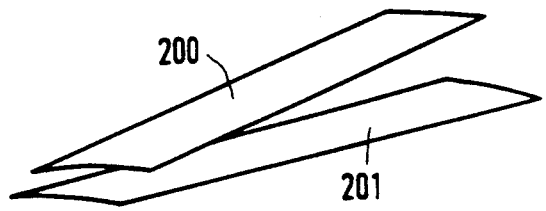

It will be obvious that within the scope of the invention many variations are possible. The example shows an electron gun for generating three electron beams. The invention can also very advantageously be used in cathode ray tubes having electron guns for generating a row of electron beams. FIGS. 12a and 12b show such an electron gun. FIG. 12a is a partly perspective elevational view. FIG. 12b is a sectional view. Electron beams 120 are emitted by emission element 122 and are accelerated and led along paths by the conductor patterns 123 situated on the flat plates 124 and 125. In this example, the plates on which the conductor patterns are provided are flat and the plates are coplanarly arranged. The plates may be slightly curved, as shown in FIGS. 13a and 13b, or they may enclose a small angle, as shown in FIG. 14. In FIGS. 13a and 13b the plates 200 and 201 are slightly curved. FIG. 13a is a perspective elevational view, FIG. 13b is a sectional view. The position of the electron beams 7, 8 and 9 is shown in FIG. 13b. The plates may be manufactured from glass or from another electrically insulating material or from a metal coated with a layer of an electrically insulating material.

Figure 15:
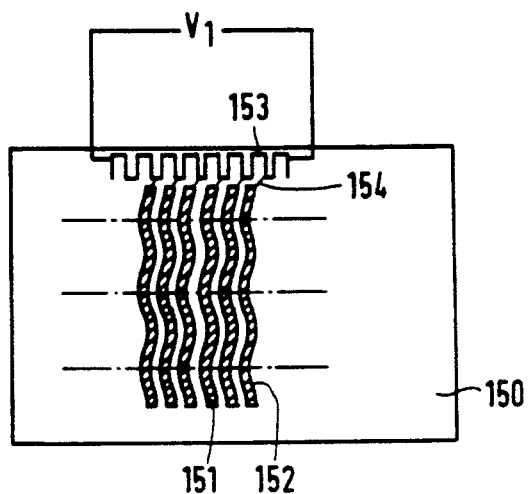
Figure 16:
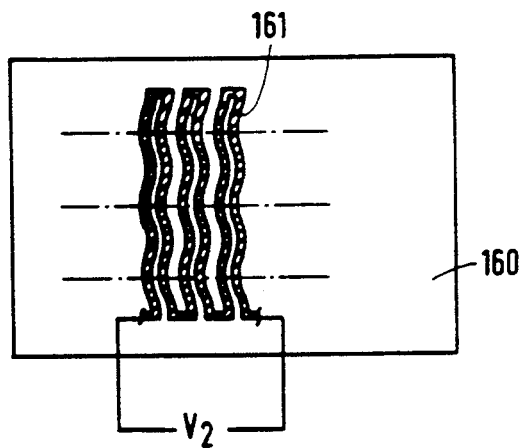

FIGS. 15 and 16 show two possible constructions for applying voltages to a conductor pattern. In FIG. 15 a meander-shaped resistor ladder 153 is provided on glass plate 150 next to the conductor pattern 151 which consists of a number of strips 152. Electric connections 154 are situated between the meander-shaped resistor 153 and the conductive strips 152. A voltage $V_1$ is applied across said meander-shaped resistor 153 by applying electric voltages to the electric connections. Possible materials for such a resistive layer are, inter alia, $RuO_2$ and $In_2O_3$. In FIG. 16 the conductor pattern 161 itself consists of a meandering layer having a certain resistive value and a voltage $V_2$ is applied between the beginning and the end of the conductor pattern. This is advantageous because fewer process steps and connection points are required.

Within the scope of the invention, "cathode ray tube" is to be understood to mean not only a display device but also, for example, an electron microscope or a picture pick-up tube. In such devices electron beams are also generated by an electron gun.

The invention is very suitable for a cathode ray tube having an in-line electron gun.

The examples show cathode ray tubes comprising an electron gun in which more than one electron beam is generated. Although the invention is very suitable for such cathode ray tubes, it is not limited thereto. In embodiments of the invention, the cathode ray tube may comprise one or more electron guns for generating one electron beam, conductor patterns being provided in the electron gun on two oppositely arranged surfaces, which conductor patterns extend in planes approximately parallel to the direction of travel of the electron beam, and the cathode ray tube comprises means of forming electric fields between the conductor patterns, which conductor patterns are formed so that, in operation, the electric fields vary in the direction of travel of the electron beam and in a direction approximately parallel to said planes and approximately transversely to the direction of travel of the electron beam. Preferably, the conductor patterns are formed so that, in operation, the electric fields focus the electron beam in two directions transversely to the direction of travel of the electron beam.

A few further variations are, for example: In the embodiments shown, the electron gun comprises plates on the facing surfaces of which conductor patterns are provided. Said plates can be considered as elements exhibiting flat surfaces on which the conductor patterns are provided. A variation may consist in that, for example, the elements on which the conductor patterns are provided have a different shape, for example two solid semicylinders facing each other with their flat sides, or two other members having flat sides facing each other.

In the embodiments shown, the electron gun comprises two plates. This does not mean, however, that the invention is limited to embodiments in which the electron gun comprises only two plates. In a variation within the scope of the invention, the electron gun may comprise several pairs of plates, for example a pair of plates having conductor patterns for prefocusing, the distance between the conductor patterns being relatively small, and a pair of plates having conductor patterns for the main lens, the distance between the conductor patterns being relatively large. Viewed in the direction of travel of the electron beams, further elements of the electron gun may be arranged between these two pairs of plates.

In the examples shown, the plates are flat. In a variation, the plates may exhibit a step, viewed in the direction of travel of the electrons. Due to this, the distance between the plates changes stepwise. This enables, for example, the prefocusing and main lens conductor patterns mentioned in the preceding paragraph to be provided on one pair of plates.

For clarity, the plates are shown as two separate conductor-pattern carrying elements in the examples. In variations of the invention, the plates may form part of a larger unit. The plates may be interconnected by means of, for example, side walls. This increases the strength of the construction and, hence, reduces the risk of fracture or microphonics. It is also possible to interconnect the conductor patterns on the two plates via the side walls, thereby permitting a reduction of the number of electric connections. The side walls may extend transversely to the plates or, for example, extend in a smooth arc from one plate to the other. the conductor patterns may blend into each other via the side walls.

I claim:

1. In a cathode ray tube comprising an electron gun for generating plural electron beams extending in one plane and having means for forming electric fields for acting on the electron beams, the improvement comprising said means for forming electric fields for acting on the electron beams comprising:
    (a) conductive patterns comprising spaced conductor portions provided on two surfaces oppositely arranged with respect to the plane of the electron beams and approximately parallel to said plane,
    (b) means for applying potentials to the conductor portions, and the conductor portions being arranged, such that electric fields are formed that vary in the direction of travel of the electron beams and in a direction approximately parallel to said plane and approximately transversely to the direction of travel of the electron beams.

2. A cathode ray tube as claimed in claim 1, characterized in that the conductor patterns are so formed that, in operation, the electric fields make the electron beams converge or diverge.

3. A cathode ray tube as claimed in claim 1, characterized in that the conductor patterns are so formed that, in operation, the electric fields focus the electron beams in two directions transversely to the direction of travel of the electron beams.

4. A cathode ray tube as claimed in claim 1, characterized in that the conductor patterns are so formed that the generated electric fields vary approximately periodically with a spatial period which is approximately equal to the lateral spacing between the electron beams.

5. A cathode ray tube as claimed in claim 4, characterized in that the quotient of the spatial period and the lateral spacing between the conductor patterns is greater than 0.5.

6. A cathode ray tube as claimed in claim 5, characterized in that the conductor patterns are so formed that the generated fields contain more periods than the number of electron beams.

7. A cathode ray tube as claimed in claim 1, characterized in that the conductor patterns are so formed that the generated electric fields vary approximately periodically with a spatial period that is approximately equal to the lateral spacing between the electron beams and, viewed in the direction of travel of the electron beams, the spatial period varies.

8. In a cathode ray tube comprising an electron gun for generating one electron beam and having means for forming electric fields for acting on the electron beam, the improvement comprising said means for forming electric fields for acting on the electron beam comprising:
    (a) conductive patterns comprising spaced conductor portions provided on two surfaces oppositely arranged with respect to the electron beam and approximately parallel to the direction of travel of the electron beam,
    (b) means for applying potentials to the conductor portions, and the conductor portions being arranged, such that electric fields are formed that vary in the direction of travel of the electron beams and in a direction approximately parallel to said plane and approximately transversely to the direction of travel of the electron beams.

9. A cathode ray tube as claimed in claim 8, characterized in that the conductor patterns are formed so that, in operation, the electric fields focus the electron beam in two directions transversely to the direction of travel of the electron beam.

10. A cathode ray tube as claimed in claim 1 or claim 9, characterized in that the conductor patterns comprise a number of curved strips of conductive material.

11. A cathode ray tube as claimed in claim 1 or claim 9, characterized in that the conductor pattern comprises a meander-shaped resistor across which an electric voltage can be applied.

12. A cathode ray tube as claimed in claim 1 or claim 9, characterized in that a meander-shaped resistor is provided next to the conductor pattern, electric connections extending between the conductor pattern and the meander-shaped resistor and an electric voltage being applicable across said meander-shaped resistor.

13. In an electron gun for generating plural in-line electron beams extending in one plane and having means for forming electric fields for focussing or accelerating all the electron beams in unison, the improvement comprising said means for forming electric fields for focussing or accelerating the electron beams comprising:
    (a) two members having flat surfaces oppositely arranged with respect to the plane of the electron beams and approximately parallel to said plane,
    (b) conductive patterns comprising conductor portions spaced in the direction of travel of the electron beams provided on each of said flat surfaces and symmetrically arranged with respect to the electron beams,
    (c) means for applying potentials to the conductor portions, and the conductor portions being arranged, such that focussing or accelerating electric fields are formed that vary in the direction of travel of the electron beams and in a direction approximately parallel to said plane and approximately transversely to the direction of travel of the electron beams.

14. The electron gun of claim 13, wherein the conductive patterns are conductive photolithographic deposits on the flat surfaces.

* * * * *